(12) United States Patent
Linstadt et al.

(10) Patent No.: US 9,571,231 B2
(45) Date of Patent: Feb. 14, 2017

(54) IN-BAND STATUS ENCODING AND DECODING USING ERROR CORRECTION SYMBOLS

(71) Applicant: Rambus Inc., Sunnyvale, CA (US)

(72) Inventors: John Eric Linstadt, Palo Alto, CA (US); Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 12 days.

(21) Appl. No.: 14/814,206

(22) Filed: Jul. 30, 2015

(65) Prior Publication Data

US 2016/0056842 A1    Feb. 25, 2016

Related U.S. Application Data

(60) Provisional application No. 62/040,325, filed on Aug. 21, 2014.

(51) Int. Cl.
| | |
|---|---|
| *H04L 1/00* | (2006.01) |
| *H03M 13/15* | (2006.01) |
| *G06F 11/10* | (2006.01) |
| *H03M 13/19* | (2006.01) |

(52) U.S. Cl.
CPC ......... *H04L 1/0047* (2013.01); *G06F 11/1004* (2013.01); *H03M 13/1575* (2013.01); *H03M 13/1515* (2013.01); *H03M 13/19* (2013.01)

(58) Field of Classification Search
CPC .................................................... H04L 1/0047
See application file for complete search history.

(56) References Cited

U.S. PATENT DOCUMENTS

| | | | | |
|---|---|---|---|---|
| 5,341,371 A | * | 8/1994 | Simpson | H04L 1/0057 360/40 |
| 7,102,544 B1 | * | 9/2006 | Liu | G06F 11/1032 341/50 |
| 8,060,774 B2 | | 11/2011 | Smith et al. | |
| 2007/0140368 A1 | * | 6/2007 | Kim | H03M 13/253 375/265 |
| 2007/0222889 A1 | * | 9/2007 | Lee | H03M 13/253 348/441 |
| 2009/0013240 A1 | * | 1/2009 | Argon | H03M 7/14 714/803 |
| 2009/0028448 A1 | * | 1/2009 | Collomosse | G09G 3/2022 382/232 |
| 2014/0089769 A1 | * | 3/2014 | Priebe | H03M 13/098 714/805 |
| 2014/0108884 A1 | * | 4/2014 | Shu | G06F 11/1064 714/758 |
| 2014/0325303 A1 | * | 10/2014 | Yang | G06F 11/10 714/752 |

\* cited by examiner

*Primary Examiner* — Joseph D Torres
(74) *Attorney, Agent, or Firm* — Fenwick & West LLP

(57) ABSTRACT

A status encoder generates a checksum that encodes a status condition together with the checksum of an associated message. A receiver determines an inverse transformation that when applied to the received status-encoded checksum recovers the parity information associated with the codeword. The status condition can then be recovered based on the selection of the inverse transformation that correctly recovers the parity information from the status-encoded checksum. Beneficially, the status condition can be encoded without requiring additional signal lines or lengthening the codeword relative to conventional error correction devices.

16 Claims, 11 Drawing Sheets

| 700-0 EXTRA=0 | | 700-1 EXTRA=1 | |
|---|---|---|---|
| | U[4:0] | U[4:0] | |
| No error | 00000 | 11111 | No error |
| Invert $T_A[0]$ | 00001 | 11110 | Invert $T_A[0]$ |
| Invert $T_A[1]$ | 00010 | 11101 | Invert $T_A[1]$ |
| Invert $Y_A[a]$ | 00011 | 11100 | Invert $Y_A[a]$ |
| Invert $T_A[2]$ | 00100 | 11011 | Invert $T_A[2]$ |
| Invert $Y_A[b]$ | 00101 | 11010 | Invert $Y_A[b]$ |
| Invert $Y_A[c]$ | 00110 | 11001 | Invert $Y_A[c]$ |
| Invert $Y_A[d]$ | 00111 | 11000 | Invert $Y_A[d]$ |
| Invert $T_A[3]$ | 01000 | 10111 | Invert $T_A[3]$ |
| Invert $Y_A[e]$ | 01001 | 10110 | Invert $Y_A[e]$ |
| Invert $Y_A[f]$ | 01010 | 10101 | Invert $Y_A[f]$ |
| Invert $Y_A[g]$ | 01011 | 10100 | Invert $Y_A[g]$ |
| Invert $Y_A[h]$ | 01100 | 10011 | Invert $Y_A[h]$ |
| Invert $Y_A[i]$ | 01101 | 10010 | Invert $Y_A[i]$ |
| Invert $Y_A[j]$ | 01110 | 10001 | Invert $Y_A[j]$ |
| Invert $Y_A[k]$ | 01111 | 10000 | Invert $Y_A[k]$ |
| Invert $T_A[4]$ | 10000 | 01111 | Invert $T_A[4]$ |
| Invert $Y_A[m]$ | 10001 | 01110 | Invert $Y_A[l]$ |
| Invert $Y_A[l]$ | 10010 | 01101 | Invert $Y_A[m]$ |
| Invert $Y_A[n]$ | 10011 | 01100 | Invert $Y_A[n]$ |
| Invert $Y_A[o]$ | 10100 | 01011 | Invert $Y_A[o]$ |
| Invert $Y_A[p]$ | 10101 | 01010 | Invert $Y_A[p]$ |
| unused | 10110 | 01001 | unused |
| unused | 10111 | 01000 | unused |
| unused | 11000 | 00111 | unused |
| unused | 11001 | 00110 | unused |
| unused | 11010 | 00101 | unused |
| unused | 11011 | 00100 | unused |
| unused | 11100 | 00011 | unused |
| unused | 11101 | 00010 | unused |
| unused | 11110 | 00001 | unused |
| unused | 11111 | 00000 | unused |

FIG. 7A

IN-BAND STATUS ENCODING AND
DECODING USING ERROR CORRECTION
SYMBOLS

RELATED APPLICATIONS

This application claims the benefit of U.S. Provisional Application No. 62/040,325 filed on Aug. 21, 2014 entitled "In-Band Status Encoding and Decoding Using Error Correction Symbols" to John Eric Linstadt and Frederick A. Ware, the content of which is incorporated by reference herein.

BACKGROUND

Existing low latency, high bandwidth, high capacity Dual Inline Memory Module (DIMM)-based Dynamic Random Access Memory (DRAM) systems have been optimized for the common case of deterministic, error-free operation. However, these systems lack a particularly efficient means of returning precise exception condition or status information back to the host system. The protocol overhead of status polling, combined with the deterministic latency optimizations results in the excessive consumption of memory channel resources. Furthermore, obtaining status information using interrupt-based signals require multiple transactions with complex flow control.

As DIMM-based memory systems evolve to encompass heterogeneous memory types (i.e., DRAM and Flash hybrid DIMMs) and greater local control of per-DIMM resources are implemented, an increased amount of status information may need to be communicated back to the host. Therefore, a low-overhead means of in-band status signaling using the existing protocols and infrastructure is desirable.

BRIEF DESCRIPTION OF THE DRAWINGS

The teachings of the embodiments herein can be readily understood by considering the following detailed description in conjunction with the accompanying drawings.

FIG. 7A is first example embodiment of a table for decoding a status condition using error correction codes according to the second embodiment.

DETAILED DESCRIPTION OF EMBODIMENTS

A status encoder generates a codeword that encodes a status condition together with a checksum of an associated message. The status encoder conditionally applies a transformation to the checksum based on the status condition to generate a status-encoded checksum. The transformation is selected from a plurality of selectable transformations, each uniquely associated with a possible status condition. A receiver determines an inverse transformation that when applied to the received status-encoded checksum recovers the checksum associated with the codeword. The status condition can then be recovered based on the selection of the inverse transformation that recovers the original checksum from the status-encoded checksum. In cases where it cannot be unambiguously determined which inverse transformation will recover the original checksum, the status condition may be re-encoded with a subsequent message, and once identified, can be used to decode both the original message and the subsequent message. Beneficially, the status condition can be encoded without adding additional signal lines or lengthening the codeword size relative to traditional error correction devices.

System Architecture

Figure 1:
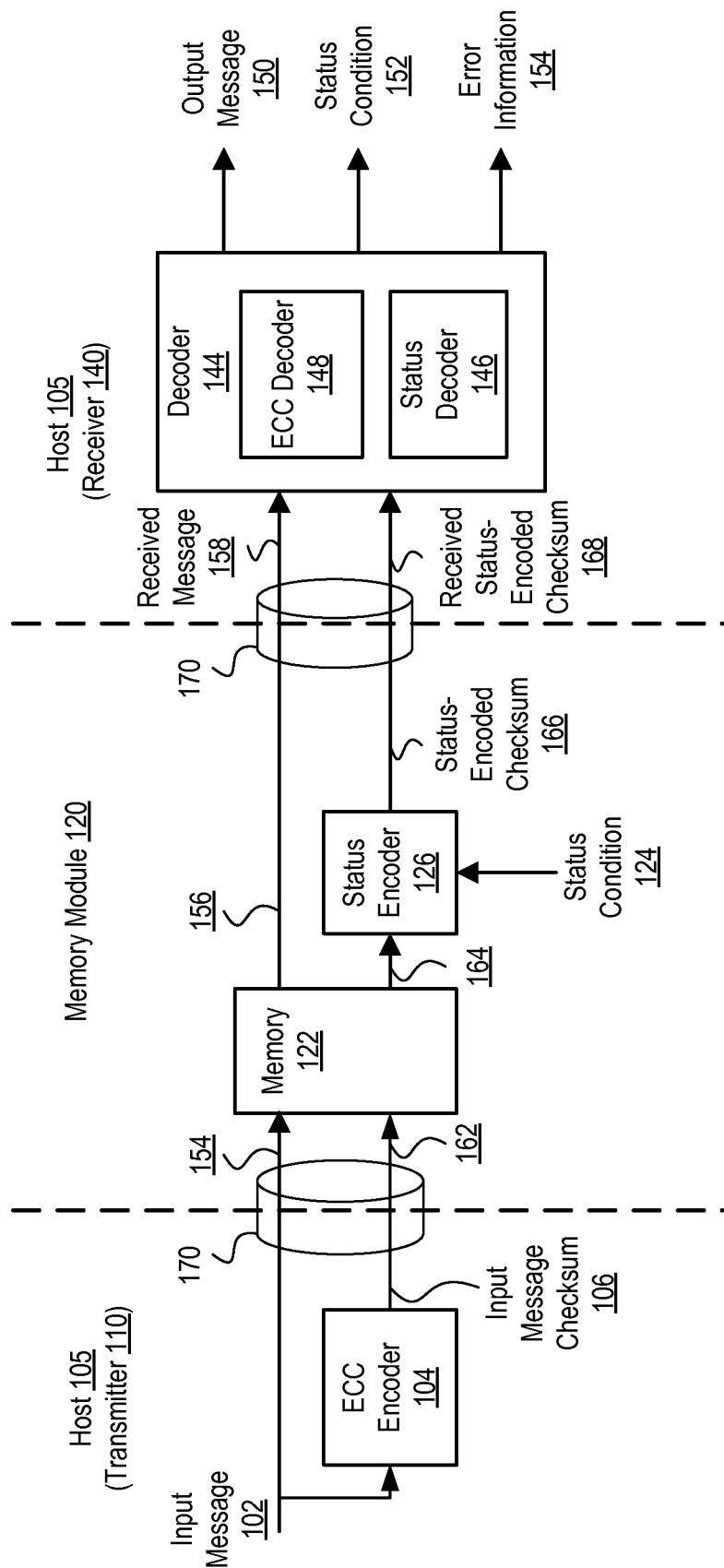
FIG. 1 is a block diagram illustrating an example embodiment of a memory system.

FIG. 1 is a block diagram of a memory system 100. Memory system 100 comprises a memory module 120 and host device 105 including a transmitter 110 and a receiver 140. In a write operation, transmitter 105 writes input message 102 to memory module 120. In a read operation, receiver 140 reads a received message 158 from memory module 120. Channel 170 between host 105 and memory module 120 may be unreliable or noisy. Furthermore, data stored in the memory module 120 may become corrupted while stored. Thus, received message 158 received by receiver 120 may contain one or more errors (e.g., bit inversions) relative to input message 102 sent by transmitter 110. Host 105 therefore utilizes an error correction technique that enables receiver 120 to detect, and in some cases, correct some number of errors in received message 158 introduced when the message is being transmitted from transmitter 110 to memory module 120 in a write operation, when the message is stored in memory module 120, or when the message is being transmitted from memory module 120 to receiver 140 in a read operation.

To facilitate error detection and/or correction, transmitter 110 includes an error correction code (ECC) encoder 104 that receives input message 102 for writing to memory module 120 and generates an input message checksum 106 representing parity information of input message 102. In a write operation, transmitter 110 transmits input message 102 and the input message checksum 106 to memory module 120 for storage.

Memory module 120 comprises a memory 122 and a status encoder 126. Memory module 120 may comprise, for example, a DIMM that includes one or more DRAM integrated circuits. Status encoder 126 may be integrated with memory 122 in a DRAM integrated circuit, or status encoder 126 may be implemented externally to memory 122 (e.g., DRAM) elsewhere on the DIMM. In alternative embodiments, memory module 120 may include other types of volatile or non-volatile memory (e.g., FLASH memory).

In a write operation, memory 122 receives and stores input message 154 and input message checksum 162 (which may differ from input message 102 and input message checksum 106 if errors are introduced in channel 170). In a read operation, memory 122 outputs input message 156 to receiver 140 (which may differ from input message 154 if the message is corrupted while stored in memory 122). Furthermore, status encoder 126 receives input message checksum 164 read from memory 122 (which may differ from checksum 162 if the checksum is corrupted while stored) and conditionally transforms input message checksum 164 based on a status condition 124 to generate a status-encoded checksum 166. Status condition 124 may be selected from a plurality of predefined selectable status conditions which may represent, for example, an acknowledgement (ACK) condition, a no acknowledge (NACK) condition, a null condition, an exception condition, flow control credits, ready/busy status, changes in internal or environmental conditions or any other information.

Receiver 140 receives received message 158 and received status-encoded checksum 168 (which may differ from message 156 and status-encoded checksum 166 if errors are introduced in channel 170). Receiver 140 includes a decoder 144 comprising an ECC decoder 148 and a status decoder 146. Generally, ECC decoder 148 includes logic that can detect up to a limited number of errors in received message 158 using received status-encoded checksum 168 and in some cases, can detect the exact bit or symbol location of the error in order to correct it. Status decoder 146 and ECC decoder 148 operate together to attempt to decode received message 158 using received status-encoded checksum 168 to recover status condition 124 (outputted as status condition 152), and input message 102 (outputted as output message 150). Decoder 144 may furthermore output error information 154 indicating, for example, that no errors were detected, that one or more errors were detected and corrected, or that one or more errors were detected and could not be corrected.

In one embodiment, ECC encoder 104 applies a block coding scheme in which each input message 102 is mapped to a status-encoded forward error correction (FEC) codeword including input message 102 and input message checksum 106. For example, in one embodiment, ECC encoder 104 applies a transform function to an input message 102 having k symbols to generate an FEC codeword having n symbols, where n>k. The codeword includes redundancy that allows receiver 140 to detect, and in some cases correct, a limited number of errors that may occur in received message 158 relative to input message 102.

Beneficially, memory module 120 can encode status condition 124 in the status encoded checksum 166 in a manner that does not add any extra bits and does not require any additional signal lines relative to a conventional ECC memory system 100. More specific details regarding the encoding process are provided below.

Various components of memory system 100 described herein may be implemented, for example, as an integrated circuit (e.g., an Application-Specific Integrated Circuit (ASIC) or using a field-programmable gate array (FPGA), in software (e.g., loading program instructions to a processor from a computer-readable storage medium and executing the instructions by the processor), or by a combination of hardware and software.

Memory system 100 described above can include error detection and/or correction encoding and decoding based on a variety of different error correction techniques. For example, in one embodiment, error detection and/or correction encoding and decoding is based on modified Hamming codewords that enable single error correction and double error detection (SECDED). For example, in one embodiment, error detection and/or correction encoding and decoding is based on modified [72,64] Hamming codewords in which eight bits encoding parity information is appended to a 64-bit message. In a conventional Hamming code, the encoded message is created by multiplying the message m by a generator matrix G, where G is of the form $(I, A^T)$. The resulting codeword c is the message m appended with additional parity bits p, $c=(m,p)=mG$. When decoding the Hamming code, the parity check matrix H is of the form (A,I). The syndrome S used to identify the error location in the received codeword c is computed as $S=Hc$. This can be factored and reduced to the mod 2 sum (XOR) of the partial syndrome $S_m=Am$ and the received parity bits p, or $S=(S_m$ XOR p)=(Am XOR p). When S=0 (Am=p), no errors are detected. For [72,64] SECDED, non-zero syndromes in the range S={1 . . . 72} identify a correctable single bit error at bit position S within the encoded message c, while syndromes in the range 73-255 indicate that a multiple bit error has been detected.

In another embodiment, error detection and/or correction encoding and decoding is based on modified systematic BCH or Chipkill encoding. In this embodiment, encoder 104 combines message symbols m to parity symbols r that are the remainder of the Galois Field division of (m,0) by a polynomial divisor p, or $c=(m,rem((m,0)/p))=(m,r)$. For example, in [144,128] BCH and Chipkill codes 32 4-bit message symbols are combined with 4 4-bit polynomial remainder symbols, allowing for the correction of a single corrupted symbol. Error detection and correction involves calculating the syndrome S as remainder of (m,r)/p. S can be factored and reduced to $S=S_m+r=rem((m,0)/p)$ XOR r. When S=0, or rem((m,0)/p)=r, no errors are detected. When S≠0, a more complicated task involving locating and correcting the errors is performed.

In yet other embodiments, a different encoding such as a Reed-Solomon encoding may be used.

In embodiments described herein, checksum 164 read from memory 122 is transformed by status encoder 126 to encode status condition 124 in status-encoded checksum 166 without adding any additional bits. For example, status encoder 126 may conditionally apply a permutation (e.g., a rotation or other bit re-arrangement) to the parity bits of checksum 164. Alternatively, status encoder 126 may conditionally flip one or more of the parity bits of checksum 164 to encode status condition 124. In one embodiment, status encoder 126 applies a bitwise XOR operation between the parity bits and one or more extra bits representing status condition 124. In a read operation, decoder 144 determines the transformation (which may be an identity transformation) applied to the parity bits by status encoder 126, and can therefore identify status condition 124 associated with the transformation and recover the syndrome S (by applying an inverse of the transformation) to detect and/or correct any errors. Examples of techniques for encoding and decoding messages are described in further detail below.

Figure 2:
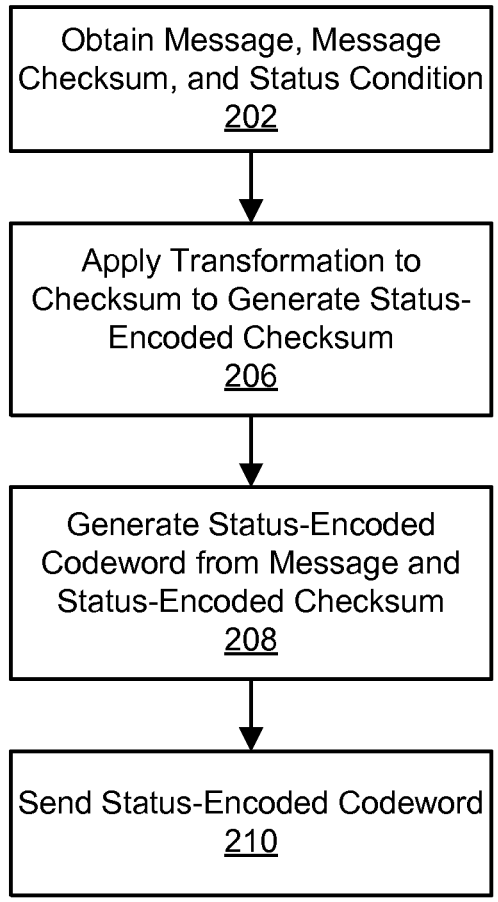
FIG. 2 is a flowchart illustrating an embodiment of a process for encoding a status condition with error correction codes.

FIG. 2 is a flowchart illustrating an embodiment of a process for generating and transmitting a status-encoded codeword that encodes an input message, parity information, and a status condition. On a read operation, memory module 120 obtains 202 an input message, a checksum for the input message, and a status condition. The checksum may be based on, for example, a Hamming encoding, a BCH encoding, a Chipkill encoding, a Reed-Solomon encoding, or other error detection/correction encoding. Memory module 120 applies 206 a transformation to the checksum to generate a status-encoded checksum. For example, memory module 120 may select a transformation from a plurality of possible predefined transformations each associated with a particular status condition to encode. In one embodiment, the transformation comprises, for example, a permutation (e.g., a rotation or re-ordering) of bits in the checksum, where each permutation corresponds to a different status condition. In another embodiment, the transformation comprises flipping one or more bits of the checksum, where different combinations of bit flips correspond to the different status conditions. The transformation may also be an identity transformation in which the status-encoded checksum is the same as the checksum. Memory module 120 generates 208 a status-encoded codeword from the input message and the status-encoded checksum. For example, in one embodiment, the status-encoded checksum is appended to the input message to generate the status-encoded codeword. The status-encoded codeword is then sent to receiver 140 via channel 170.

Figure 3:
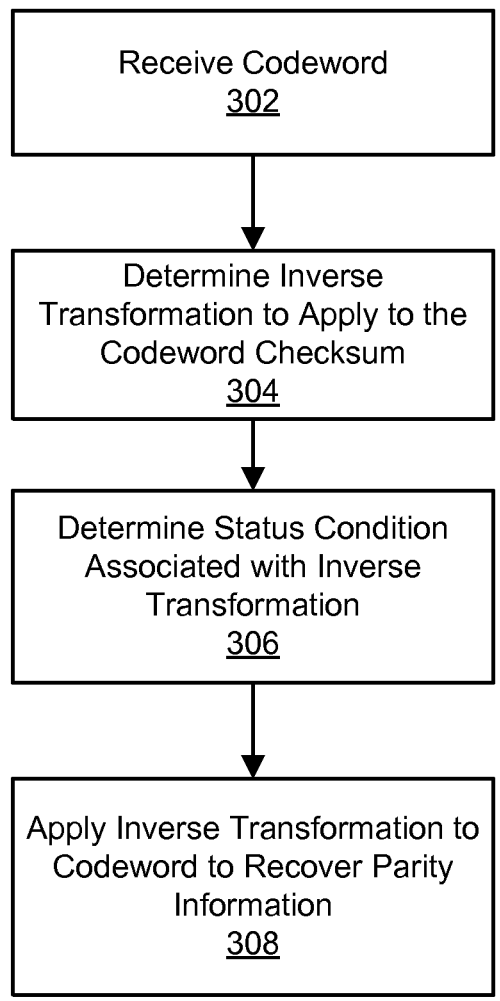
FIG. 3 is a flowchart illustrating an embodiment of a process for decoding an error correction codeword with an encoded status condition.

FIG. 3 is a flowchart illustrating an embodiment of a process for receiving a codeword and recovering the original message and status condition, if possible, or otherwise detecting up to a limited number of errors. Decoder 144 receives 302 a codeword from memory module 120, which may have one or more errors relative to the original input message and checksum prior to being written to memory module 120. Decoder 144 determines 304 an inverse transformation to apply to the received codeword. Particularly, status decoder 146 operates in conjunction with ECC syndrome generation and evaluation logic within ECC decoder 148 to evaluate the possible inverse transformations to enable decoding of status condition 152, output message 150, and error information 154. The inverse transformation, when applied to the status-encoded checksum of the received codeword recovers parity information associated with the first codeword. The inverse transformation is selected from a plurality of selectable inverse transformations (which may include an identity transformation) that each corresponds to a particular status condition, and each of which reverses a corresponding transformation applied by status encoder 126. Decoder 144 determines 306 the status condition associated with the inverse transformation that correctly reverses the transformation applied at status encoder 126. The determined inverse transformation is applied 308 to the received status-encoded checksum 168 to recover the checksum. The checksum may then be used to detect and/or correct errors in the received codeword to generate the output message.

Figure 4:
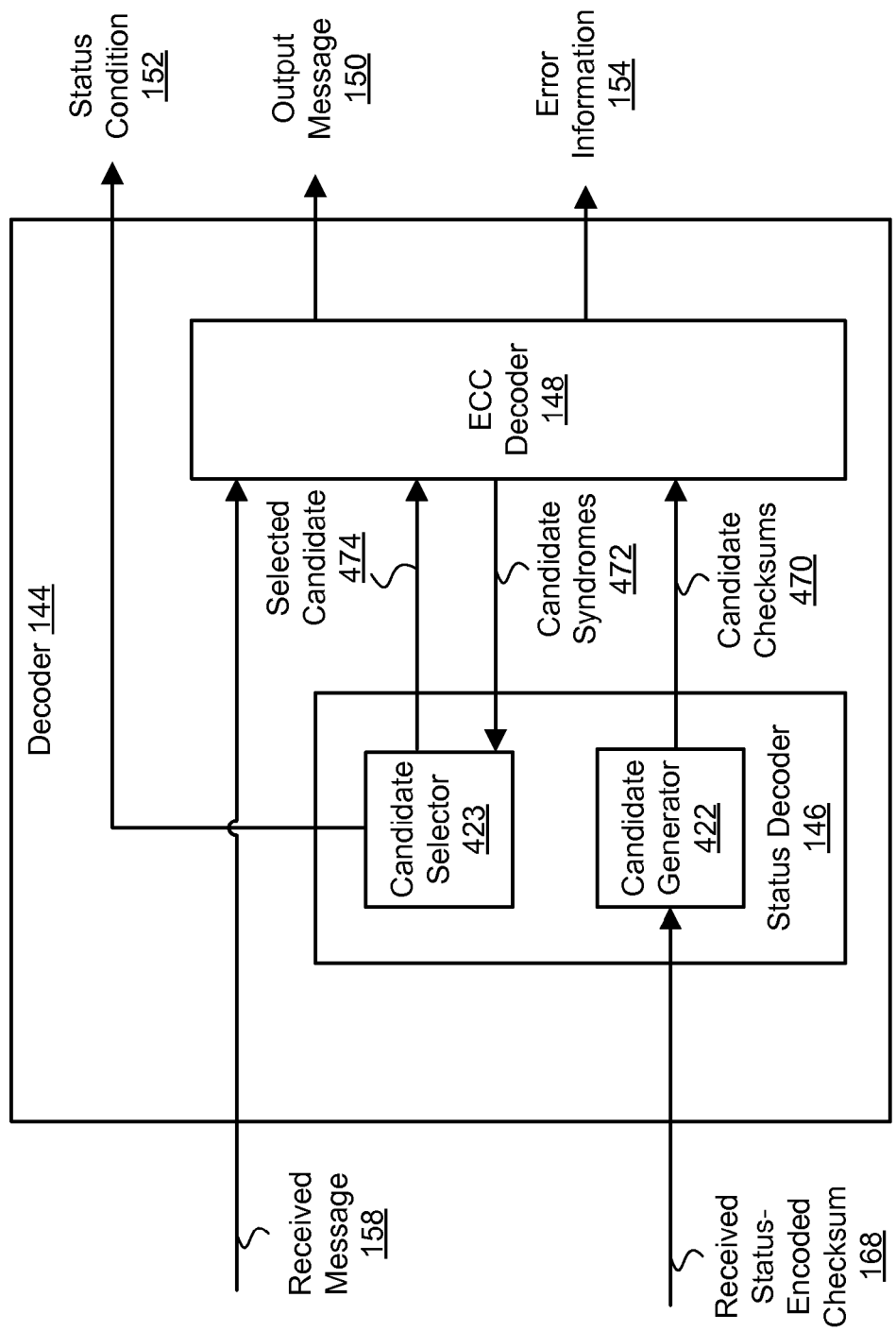
FIG. 4 is a block diagram illustrating a first embodiment of a communication system that communicates a status condition using error correction codes.

A number of different techniques may be used to determine which inverse transformation will yield the correct parity information when applied. FIG. 4 illustrates a first embodiment of a decoder 144 that operates according to the principles described above. Status decoder 146 comprises a candidate generator 422 and a candidate selector 423. Candidate generator 422 receives received status-encoded checksum 168 and applies each of a set of possible inverse transformations (corresponding to each of the plurality of status conditions) to received status-encoded checksum 168 to generate a plurality of candidate checksums 470, each corresponding to one of the possible status conditions. Syndrome evaluation logic within ECC decoder 148 generates candidate syndromes 472 for each of the candidate checksums 470 based on received message 158, and outputs candidate syndromes 472 to candidate selector 423. Candidate selector 423 selects the candidate checksum that represents the fewest number of errors from among the candidate checksums and outputs the status condition 152 associated with the inverse transformation used to generate the selected checksum. Selected candidate syndrome 474 is also provided to ECC decoder 148. ECC decoder 148 decodes received message 158 using selected candidate checksum 474 using conventional ECC decoding techniques to generate the output message 150 and error information 154.

In the embodiment of FIG. 4, the set of transformations corresponding to the different status conditions are chosen such that if a single error occurs (e.g., a single bit error for Hamming codes or a single symbol error for Chipkill codes), an inverse transformation applied to the received status-encoded checksum will never produce a candidate checksum that indicates an error-free transmission. In other words, when a single bit or symbol error occurs, any of the inverse transformations applied to the status-encoded checksum will result in a candidate checksum corresponding to a single or double error. Since the maximum likelihood condition (lowest error checksum) is always selected in this embodiment, this limitation ensures that a single error will never be mistaken for an error-free transmission or vice versa. Furthermore, the status condition can always be unambiguously recovered for an error-free transmission.

If a single error occurs, the status condition can still be unambiguously determined in cases where only one of the candidate checksums is associated with a single error. In other cases where one or more errors occur, the status condition may be ambiguous because no candidate checksum indicates a no-error condition and two or more candidate checksums indicate a single error condition. In the case that the correct candidate checksum cannot be unambiguously determined, receiver 140 may request re-transmission of the input message without status encoding. Overhead associated with re-transmission is generally very low because errors are expected to occur very infrequently.

Figure 5A:
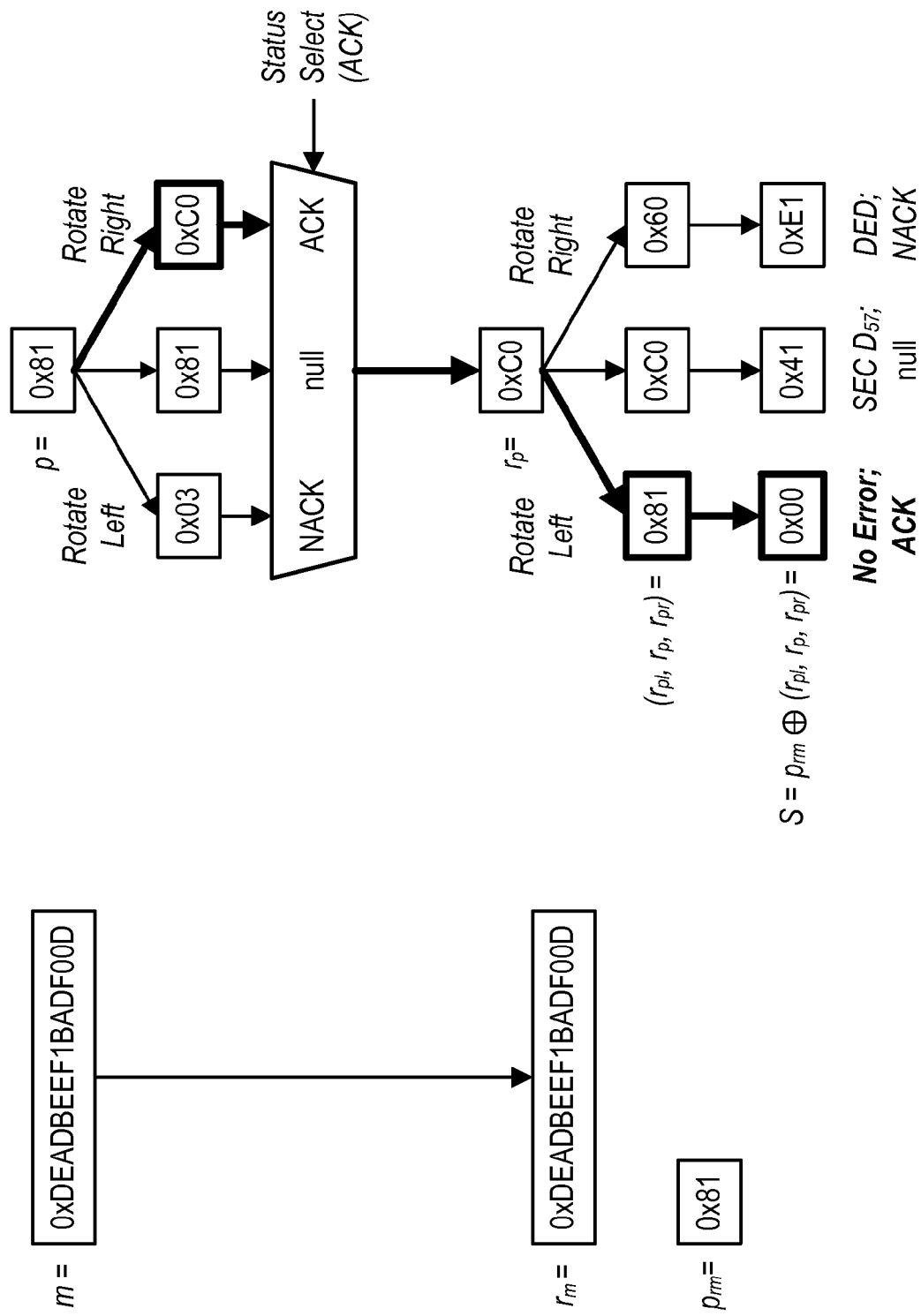
FIG. 5A is a diagram illustrating a first example operation of a communication system according to the first embodiment.

FIG. 5A illustrates an example corresponding to the architecture of FIG. 4 described above. This example, assumes that no errors occur when the message is being transmitted or in storage. In this example, the encoding and decoding is based on a modified [72,64] Hamming encoding that allows for single error correction and double error detection. In the illustrated example, ECC encoder 104 receives a 64-bit input message m=0xDEADBEEF1BADF00D. ECC encoder 104 generates a checksump=0x81 representing parity information of the message m based on conventional [72, 64] Hamming codes. On a read operation, status encoder 126 selects between one of three predefined transformations each corresponding to a different status condition. For example, in the illustrated embodiment a left circular one-bit rotation corresponds to a NACK status condition, an identity transformation (i.e., no rotation) corresponds to a null status condition, and a right circular one-bit rotation corresponds to an ACK status condition. In the illustrated example, status encoder 126 transforms the checksump=0x81 by applying the right circular one-bit rotation (resulting in a status-encoded checksump'=0xC0), thus encoding the ACK status condition. The message m and status-encoded checksump' is transmitted to receiver 140. Thus, receiver 140 receives a received message $r_m$=m=0xDEADBEEF1BADF00D and a received status-encoded checksum $r_p$=p'=0xC0. At decoder 144, candidate generator 422 applies each of a predefined set of inverse transformations to the received status-encoded checksum $r_p$ to generate a set of candidate status-encoded checksums 470, where each of the predefined set of inverse modifications reverses one of the predefined set of transformations applied at status encoder 126. Thus, in this example, candidate generator 422 applies a left circular one-bit rotation to the received status-encoded checksum $r_p$ to generate a first candidate checksums $r_{pl}$=0x81, applies an identity transformation (i.e., no rotation) to the received status-encoded checksum $r_p$ to generate a second candidate checksum $r_p$=0xC0, and applies a right circular one-bit rotation to the received status-encoded checksum $r_p$ to generate a third candidate checksum $r_{pr}$=0x60. ECC decoder 148 calculates a syndrome S associated with each of the candidate checksums by applying an XOR operation between the calculated checksum $p_{rm}$ for the received message $r_m$ and each of the candidate checksums $r_{pl}$, $r_p$, $r_{pr}$, resulting in candidate syndromes 472 of 0x00, 0x41, 0xE1 respectively. According to conventional Hamming codes, the syndrome 0x00 represent a no-error condition, the syndrome 0x41 represents a single error condition at bit location $D_{57}$, and the syndrome 0xE1 represents a double error condition. Candidate selector 423 selects the syndrome 0x00 associated with the error-free transmission as selected candidate 474 because this syndrome represents the fewest number of errors. Since the selected syndrome 474 resulted from the rotate left inverse transformation, candidate selector 423 determines that status encoder 126 applied a right rotation, and therefore recovers the ACK status condition as status condition 152. Since the syndrome 0x00 represents a no-error condition, no error correction is performed.

The set of predefined inverse transformations (i.e., left rotation, identity, right rotation) in this example have the desirable property that when a single error occurs, the plurality of candidate checksums will never result in candidate syndromes associated with an error-free transmission. This is because a single error condition always results in a non-zero syndrome, and a rotation of a non-zero syndrome can never yield a syndrome of zero associated with an error-free transmission. Other transformations may also be used that exhibit a similar property.

Figure 5B:
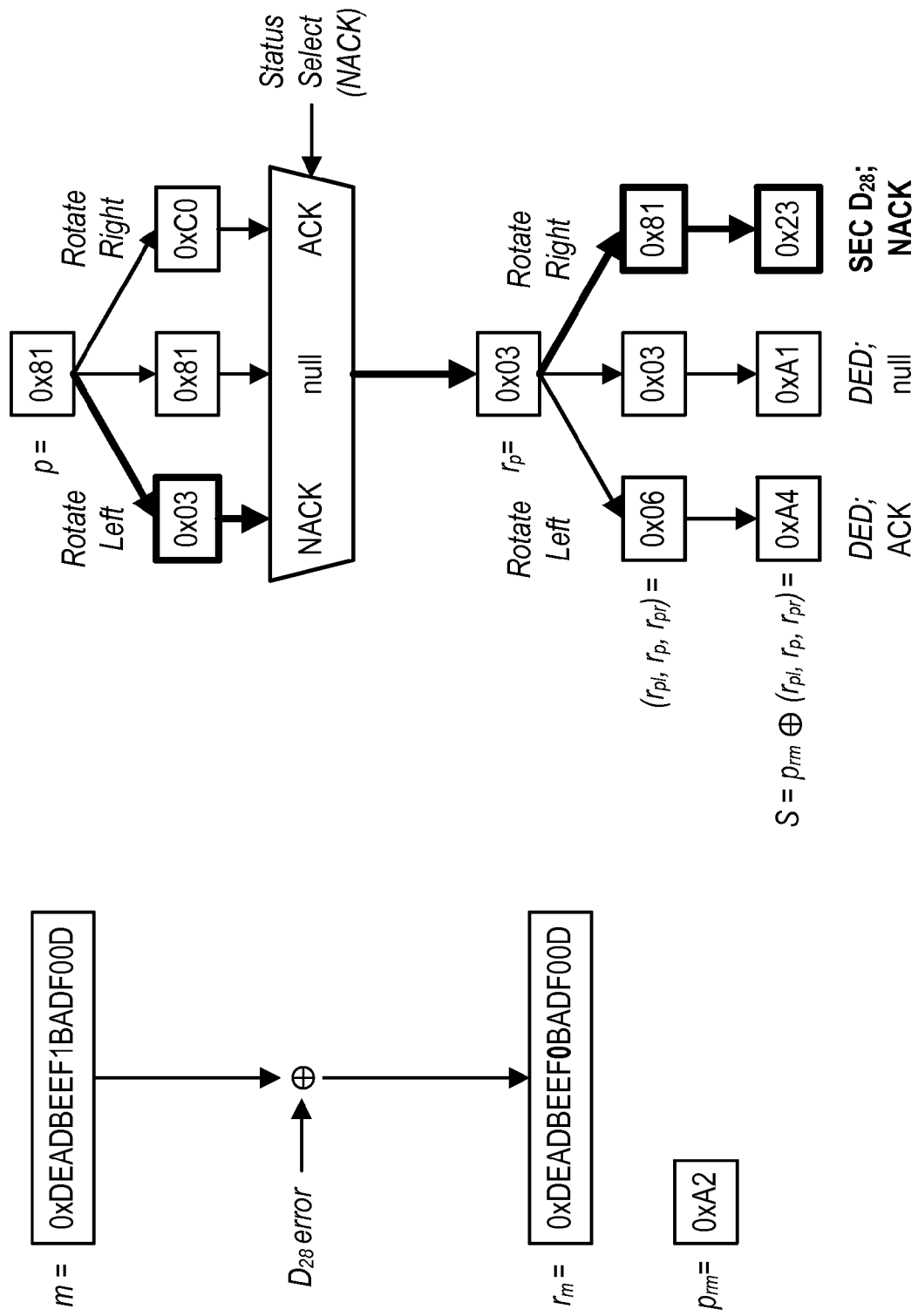
FIG. 5B is a diagram illustrating a second example operation of a communication system according to the first embodiment.

FIG. 5B illustrates an example similar to FIG. 5A, but in this case a single bit error occurs at bit location $D_{28}$, resulting in the received message $r_m$=0xDEADBEEF0BADF00D and a calculated checksum of the received message $p_{rm}$=0xA2. Furthermore, in this embodiment, the status condition NACK is selected, resulting in a status encoded checksum p'=0x03. In this case, the three candidate checksums result in syndromes 0xA4 corresponding to a double error condition, 0xA1 corresponding to a double error condition, and 0x23 corresponding to a single error condition at bit location $D_{28}$. Because the single error condition represents the fewest number of errors, candidate selector 423 correctly determines that the status condition is NACK. Furthermore, the ECC decoder 425 can correct the received message $r_m$ by correcting the error at bit location $D_{28}$.

Figure 5C:
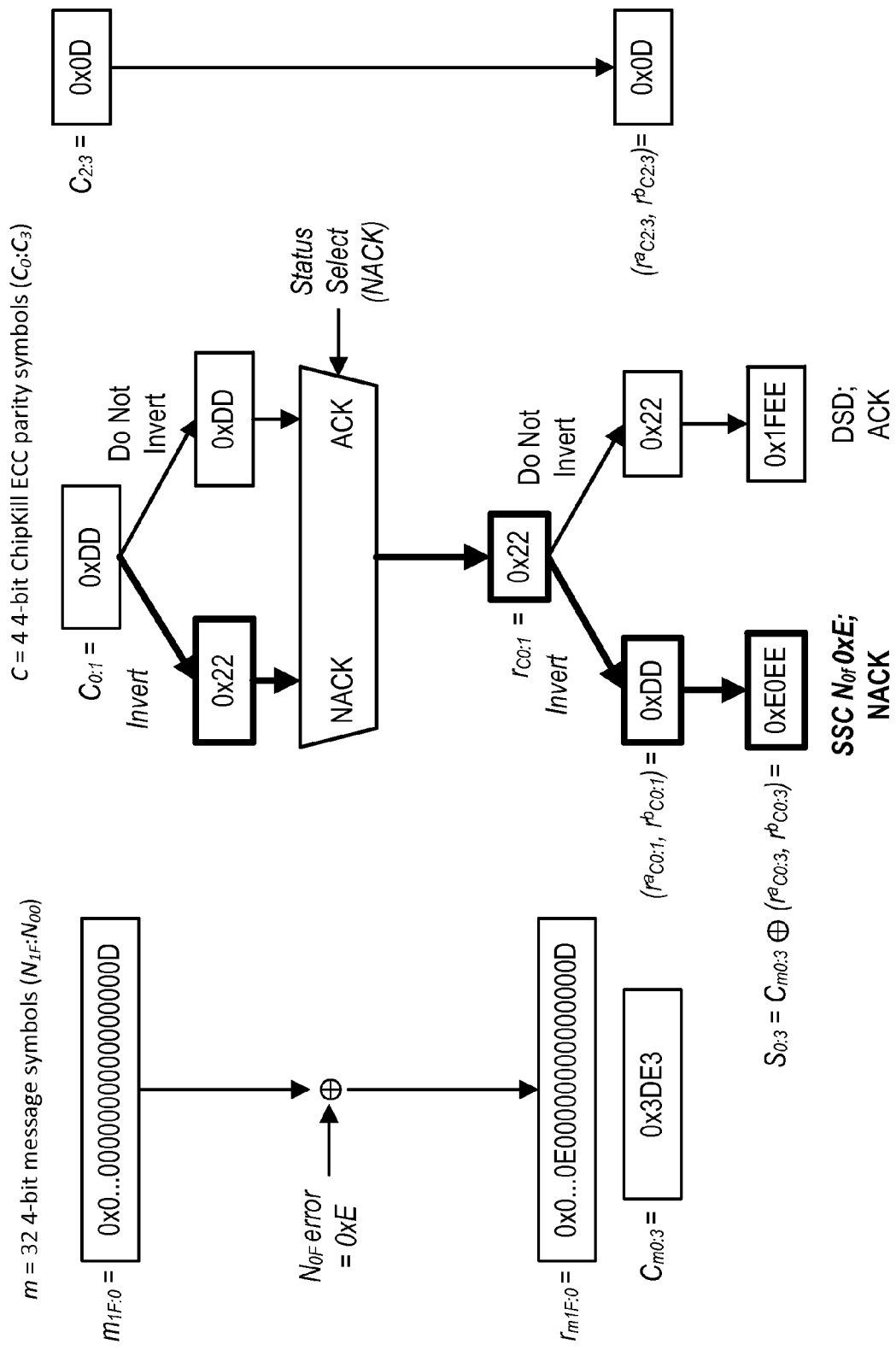
FIG. 5C is a diagram illustrating a third example operation of a communication system according to the first embodiment.

FIG. 5C illustrates another example based on a systematic [144,128] Chipkill code that enables single 4-bit symbol error correction and double 4-bit symbol error detection for an input message having a sequence of 32 4-bit message symbols appended with 4 4-bit parity checksum symbols. In the illustrated example, ECC encoder 104 receives an input message of 32 4-bit symbols m[127:0]=$m_{N1F:N0}$=0x0 . . . 0000000000000000D. ECC encoder 104 generates a 16-bit (4 4-bit symbol) checksum $C_{3:0}$=0xD0DD representing parity information of the message m based on Chipkill codes and writes these to memory module 120. On a read operation, status encoder 126 applies a transformation to the $0^{th}$ and $1^{th}$ symbol $C_{0:1}$=0xDD selected from a predefined set of transformations depending on a status condition. For example, in the illustrated embodiment, status encoder 126 inverts each bit of $C_{0:1}$ to encode a NACK status condition, and does not invert $C_{0:1}$ (i.e., applies an identity transformation) to encode an ACK status condition. In the illustrated example, status encoder 126 encodes the NACK status condition by inverting $C_{0:1}$=0xDD. This results in a status-encoded checksum $C'_{3:0}$=0xD022. The message m and status-encoded checksum C' is transmitted to the receiver 140. In the illustrated example, an error occurs at symbol location $N_{0F}$ in which three bit flips occur at bits [3:1]. Thus, receiver 140 receives a received message $r_m$=0x0 . . . 0E00000000000000D and receives the status-encoded checksum $r_{C0:3}$=$C_{0:3}$=0x220D. Candidate generator 422 generates a plurality of candidate status-encoded checksums $r^a_C$, $r^b_C$, by applying each of a predefined set of inverse transformations, where each of the predefined set of inverse transformations reverses one of the predefined set of transformations that can be applied at status encoder 126. Thus, in this example, candidate generator 422 generates a candidate checksums 470 including first candidate checksum $r^a_{C0:3}$=0xDD0D by inverting the bits of the $0^{th}$ and $1^{th}$ symbol of the received status-encoded checksum $C_{0:3}$, and generate a second candidate checksums $r^b_{C0:3}$=0x220D based on an identity transformation (i.e., without inverting the $0^{th}$ and $1^{th}$ symbol of the received status-encoded checksum $C_{0:3}$). ECC decoder 148 calculates a syndrome S associated with each of the candidate checksums 470 by applying an XOR operation between the calculated checksum $C_{m0:3}$=0x3DE3 for the received message $r_m$ and each of the candidate checksums $r^a_C$, $r^b_C$ resulting in candidate syndromes 472 of $S_{0:3}$=0xE0EE, 0x1FEE respectively. According to conventional Chipkill codes, the syndrome 0xE0EE represents a correctable single symbol error at symbol position $N_{0F}$ with bits [3:1] flipped and the syndrome 0x1FEE represents a detected double symbol error. Candidate selector 423 selects as selected candidate 474 the syndrome that evaluates to the maximally likely case of the fewest errors, in this case the syndrome $S_{0:3}$=0xE0EE associated with the single error condition. Candidate selector 423 furthermore determines that the selected syndrome 474 resulted from the inverse transformation associated with the NACK status condition and outputs this as status condition 152. ECC decoder 148 corrects the error in received message 158 using the selected candidate syndrome 470 of $S_{0:3}$=0xE0EE.

The set of predefined inverse transformations in this example have the desirable property that when a single error occurs, the plurality of candidate checksums will never result in candidate syndromes associated with an error-free transmission. This is because when a single error occurs, an inversion of $C_{0:1}$ will never yield a syndrome associated with an error-free transmission. Other transformations may also be used that exhibit a similar property.

Figure 6:
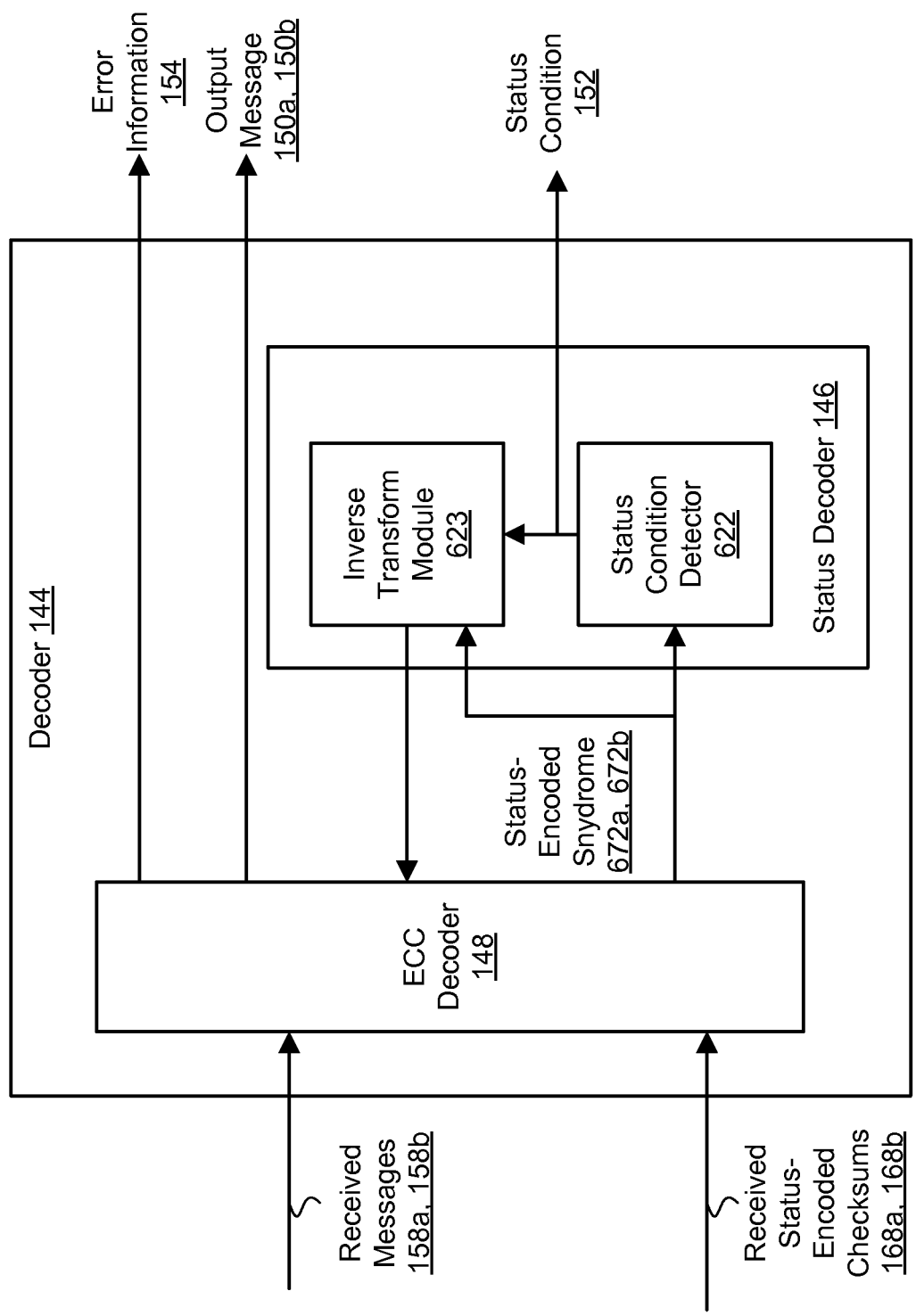
FIG. 6 is a block diagram illustrating a second embodiment of a communication system that communicates a status condition using error correction codes.

FIG. 6 illustrates an alternative embodiment of a decoder 144. This embodiment may reduce the likelihood of decoder 144 not being able to unambiguously decode the status condition and input message relative to the embodiment of FIG. 4. Particularly, the embodiment of FIG. 6 enables unambiguous recovery of an input message and a status condition for any error-free transmissions and for any single error transmission when it is followed by an error-free transmission. In this embodiment, the same status condition is re-transmitted with a subsequent message whenever the status condition cannot be unambiguously determined when a single error occurs. If the second message is error-free, the status condition can be identified and both messages recovered.

In this embodiment, status encoder 126 encodes a sequence of messages including a first input message A and a second input message B with the same status condition 124. For example, in one embodiment, a one bit status condition 124 is used to encode one of two possible status conditions (e.g., ACK and NACK) and status encoder 126 conditionally inverts all of the checksum bits depending on the status condition. In this embodiment, status encoder 126 can be implemented with a plurality of XOR gates configured so that each bit of the checksum is inverted depending on a one-bit select input (i.e., an extra bit). In another embodiment, a multi-bit status condition 124 may be used in which status encoder 126 conditionally inverts corresponding bits of the checksum depending on status condition 124. For example, status encoder 126 applies a bitwise XOR operation between an extra word ("EXTRA") representing status condition 124 and the checksum to generate a status-encoded codeword. Decoder 144 receives received messages 158a, 158b and received status-encoded checksums 168a, 168b.

In this embodiment, status decoder 146 comprises a status condition detector 622 and an inverse transform module 623. ECC decoder 148 receives messages 158, 158b and received status-encoded checksums 168a, 168b and generates status encoded syndromes 672a, 672b. Status condition detector 622 receives status-encoded syndromes 672a, 672b corresponding to the first and second receives messages 158a, 158b and determines the status condition 152. In one embodiment, status condition detector 622 includes a lookup table that stores each of the possible status-encoded syndromes that could result from the received status-encoded checksums 168a, 168b when an error-free or single error occurs. Some of these status-encoded syndromes are unique to a particular status condition and the status condition can be uniquely determined by performing a lookup in the table. In other cases, a given syndrome can result from two or more possible status conditions. In these cases, a second message is transmitted using the same status condition. If the resulting status-encoded syndrome for the second message is unique to one particular status condition then the status condition can be determined and syndromes for both the first and second messages can be derived. In one embodiment, status conditions are encoded in a manner that ensures that an error-free transmission will result in a syndrome that is uniquely associated with a single status condition. Thus, when a unique status-encoded syndrome is detected, the status condition can be unambiguously determined and the syndrome derived. Because errors are expected to occur infrequently, the status condition can generally be detected from at least one of the two received messages 158a, 158b. Once the status condition 152 is detected, an inverse transform module 623 applies an inverse transform to the received codewords based on the status condition 152. For example, inverse transform module 623 may be implemented with a plurality of XOR gates configured to perform a bitwise XOR operation between syndromes derived from the received codeword and an EXTRA bit or word representing the status condition 152. ECC decoder 148 then decodes the codewords to generate output messages 150a, 150b and error information 154.

FIG. 7A illustrates an example status-encoded syndrome table associated with an embodiment that uses a one-bit status condition represented by an EXTRA bit that conditionally inverts bits of a 6-bit Hamming code checksum depending on two possible status conditions (e.g., ACK and NACK). In this embodiment, a 6-bit status-encoded syndrome is derived at decoder 144 which includes an R bit (not shown in FIG. 6A) to indicate a double error detection and bits U[4:0] to indicate location of a single bit error, if present. When R=1, a double error is detected (which is not correctable) and a re-transmission may be requested. Otherwise, when R=0, table 700-0 illustrates each possible value of U[4:0] in the status-encoded syndrome and the corresponding error condition it represents that can result when the checksum is not inverted (e.g., EXTRA=0) at status encoder 126. Table 700-1 illustrates each possible values of U[4:0] in the status-encoded syndrome and the corresponding error condition it represents that can result when the checksum is inverted (e.g., EXTRA=1) at the status encoder 126. As can be seen, in an error-free transmission, U[4:0] will be 00000 when EXTRA=0 or 11111 when EXTRA=1. The status condition can be unambiguously determined when either of these status-encoded syndromes are found because 00000 is used only when EXTRA=0 and 11111 is used only when EXTRA=1. The status condition can also be unambiguously determined for some, but not all, single-bit error transmissions. For example, the status condition can be unambiguously determined as EXTRA=0 (i.e., checksum is not inverted at status encoder 126) when U[4:0] is in the range [00001, 01001] because these syndromes are unused when EXTRA=1. Furthermore, the status condition can be unambiguously determined as EXTRA=1 (checksum is inverted at status encoder 126) when U[4:0] is in the range [10110, 11111] because these syndromes are unused when EXTRA=0. However, the remaining syndromes are ambiguous because they may appear for either status condition. For example, if U[4:0]=01100 is derived from the received codeword, either status condition is possible depending on whether an error occurred at bit position $Y_A[h]$ or at bit position $Y_A[n]$.

The ambiguity may be resolved if the second message results in a status-encoded syndrome from which the same status condition can be unambiguously determined. For example, if the second message results in a syndrome 11111, it can be determined that EXTRA=1 and therefore the error in the first message is at bit position $Y_A[n]$. On the other hand, if the second message results in a syndrome 00000, it can be determined that EXTRA=0 and therefore the error in the first message is at bit position $Y_A[h]$.

If the second message also results in an ambiguous status-encoded syndrome, a third message encoded with the same status condition may be sent, or re-transmission requested. However, because errors are expected to occur very infrequently, it is highly likely that at least one of two consecutive messages will be error-free, thus enabling the status condition and both input messages to be unambiguously determined.

Figure 7B:
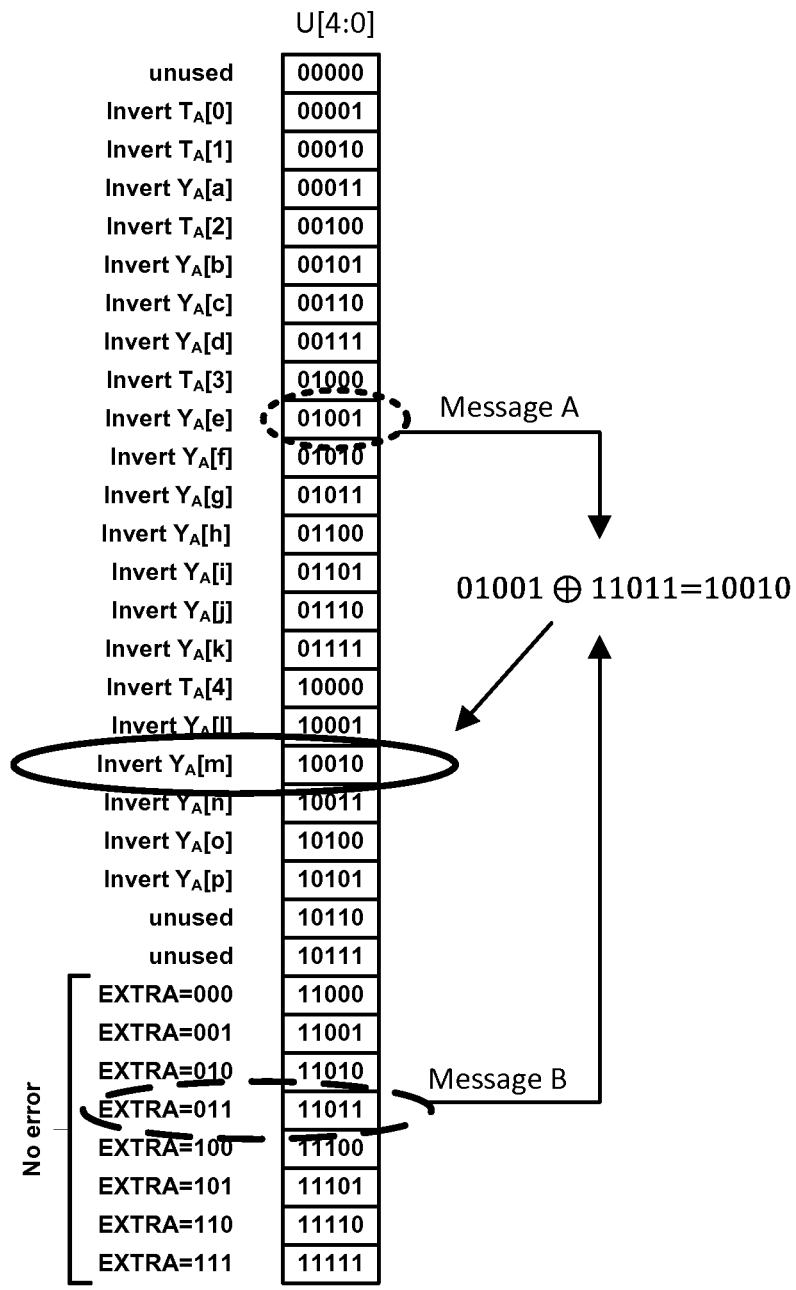
FIG. 7B is second example embodiment of a table for decoding a status condition using error correction codes according to the second embodiment.

FIG. 7B illustrates another example in which the status condition is encoded as a 3-bit word EXTRA={E2, E1, E0}, thus allowing for up to eight different status conditions to be encoded. Status encoder 126 determines the status-encoded checksum by applying a bitwise XOR operation between an EXTRA word {0, 1, 1, E2, E1, E0} and a 6-bit checksum. When R=1, a double error is detected (which is not correctable) and a re-transmission may be requested. Otherwise, when R=0 the table in FIG. 7B illustrates each of the possible syndromes and their corresponding error conditions. As can be seen, there are eight possible syndromes that can result from an error-free transmission, and the status condition can be unambiguously determined from the syndrome whenever an error-free transmission occurs. Other syndromes yield ambiguous status conditions. In these, cases the EXTRA bits (and associated status condition) can be determined from a syndrome of a second message if that message is transmitted error free (or otherwise results in an unambiguous syndrome). Once the EXTRA bits are known, the correct syndrome associated with the first message can be determined. For example, if U[4:0]=10010 is determined for the first message, the syndrome is ambiguous, and may result from a number of different single error locations and status conditions. A second message has U[4:0]=11011 which is unambiguously associated with an error-free transmission and EXTRA=011. Decoder 144 applies a bitwise XOR operation between U[4:0] for the first status-encoded syndrome 10010 and U[4:0] for the second status-encoded syndrome 11011 to yield 01001 corresponding to an error at bit position $Y_A[e]$.

In other alternative embodiments, the architecture of FIG. 6 may be used with different types of error correction codes such as Chipkill codes. Furthermore, in other alternative embodiments, different types of transformations may be performed to encode different status conditions depending on the type of error correction codes being used.

Figure 8:
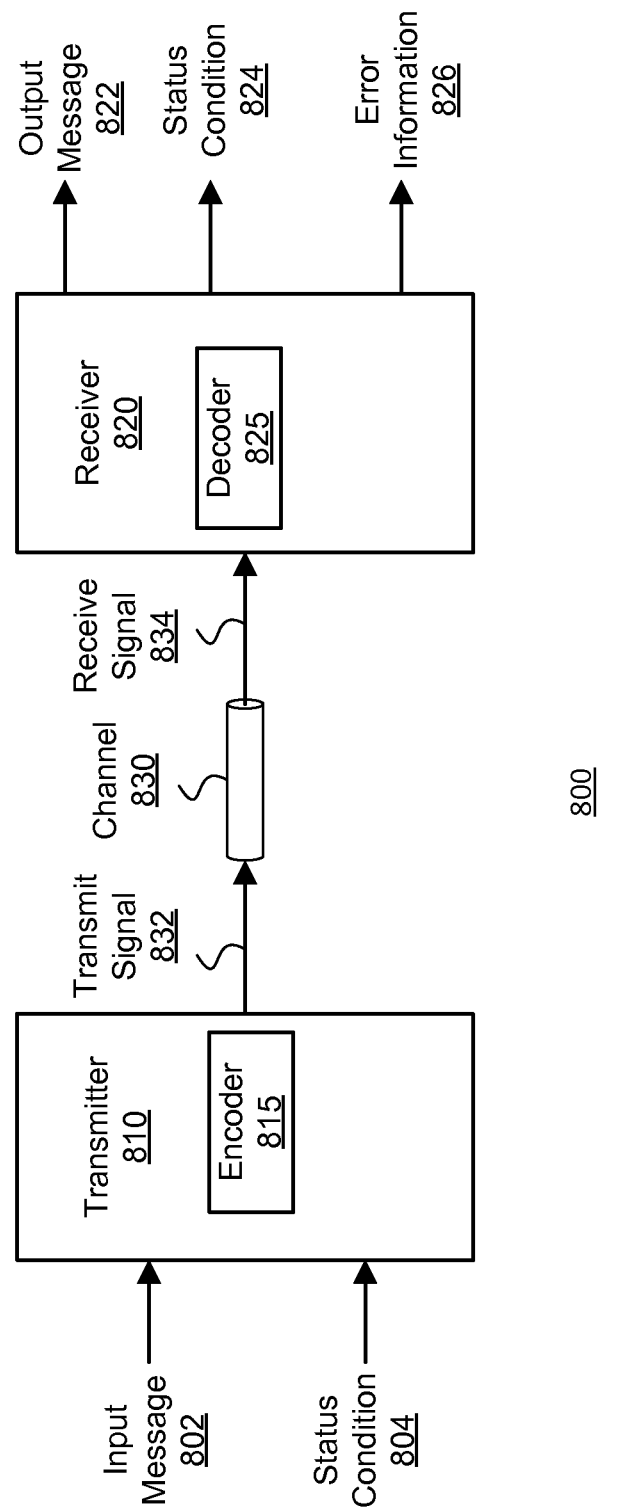
FIG. 8 is a block diagram illustrating an example embodiment of a communication system.

In another embodiment, the principles described above may be applied to encoding status information in a classical communication system that is not necessarily in the context of a memory system. For example, FIG. 8 illustrates a communication system 800 comprising a transmitter 810 and a receiver 820. Transmitter 810 includes an encoder 815 that receives an input message 802 and a status condition 804 and generates a transmit signal 832 output to communication channel 830. Transmit signal 832 comprises an ECC codeword that includes input message 802 and an appended status-encoded checksum. Particularly, encoder 815 generates an ECC checksum for input message 802, and applies a transformation to the checksum based on status condition 804 to generate the status-encoded checksum. Thus, in one embodiment, encoder 815 performs functions similar to ECC encoder 104 and status encoder 126 described above. Receiver 820 receives a receive signal 834 (which may differ from transmit signal 832 if errors are introduced in channel 830) and generates an output message 822, status condition 824, and error information 826. Receiver 820 includes a decoder 825 that operates similarly to decoder 144 described above. For example, decoder 825 can operate according to the embodiments of FIG. 4 or FIG. 6 described above. Beneficially, the communication system of FIG. 8 enables a status condition 804 to be encoded with an ECC checksum without requiring additional bits or signal lines relative to a conventional ECC transmitter and receiver.

Upon reading this disclosure, those of ordinary skill in the art will appreciate still alternative structural and functional designs and processes for the described embodiments, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A method for decoding a received codeword and decoding a status condition associated with the received codeword, the method comprising:
receiving a first codeword, the first codeword including a first message and a first status-encoded checksum, the first status-encoded checksum encoding first parity information relating to the first message and a status condition associated with the first message;
determining based on the first codeword, an inverse transformation that when applied to the first status-encoded checksum of the first codeword recovers the first parity information associated with the first codeword, the inverse transformation determined from a set of selectable inverse transformations each associated with one of a plurality of possible status conditions;
determining the status condition associated with the determined inverse transformation; and
applying the determined inverse transformation to the first codeword to recover the first parity information.

2. The method of claim 1, wherein determining the inverse transformation comprises:
applying each of the set of selectable inverse transformations to the first status-encoded checksum to generate a plurality of candidate checksums; and
determining the inverse transformation that when applied to the first status-encoded checksum results in a most likely checksum that indicates a fewest number of errors of the plurality of candidate checksums.

3. The method of claim 2, wherein the set of selectable inverse transformations are such that when a single bit or symbol error is present in the first codeword, none of the plurality of candidate checksums indicates that there are no errors in the first codeword.

4. The method of claim 2, further comprising:
performing error detection for the first codeword using the most likely checksum.

5. The method of claim 4, wherein performing error detection comprises performing at least one of a Hamming decoding, a Chipkill decoding, a BCH decoding, and a Reed-Solomon decoding.

6. The method of claim 1, wherein determining the inverse transformation comprises:
applying each of the set of selectable inverse transformations to the first status-encoded checksum to generate a plurality of candidate checksums;
determining that two or more inverse transformations when applied to the first status-encoded checksum result in candidate checksums each indicating a fewest number of errors; and
requesting retransmission of the first codeword.

7. The method of claim 1, wherein determining the inverse transformation comprises:
receiving a second codeword, the second codeword including a second message and a second status-encoded checksum, the second status-encoded checksum encoding second parity information relating to the second message and the status condition;
determining based on the second status-encoded checksum that no error is present in the second codeword; and
determining the inverse transformation from the second-status encoded checksum.

8. The method of claim 1, wherein the transformation comprises at least one of: a permutation, a rotation, a bit inversion, and an identity transformation.

9. The method of claim 1, wherein the plurality of possible status conditions comprise an acknowledge condition, a no acknowledge condition, and a null condition.

10. A decoder, comprising:
status decoder logic to receive a first codeword, the first codeword including a first message and a first status-encoded checksum, the first status-encoded checksum encoding first parity information relating to the first message and a status condition associated with the first message, to determine, based on the first codeword, an inverse transformation that when applied to the first status-encoded checksum recovers the first parity information associated with the first codeword, the inverse transformation determined from a set of selectable inverse transformations each associated with one of a plurality of possible status conditions, and to determine the status condition associated with the determined inverse transformation; and an error correction decoder to apply the determined inverse transformation to the first codeword to recover the first parity information.

11. The decoder of claim 10, wherein the status decoder logic comprises:
   candidate generator logic to apply each of the set of selectable inverse transformations to the first status-encoded checksum to generate a plurality of candidate checksums; and
   candidate selector logic to determine the inverse transformation that when applied to the first status-encoded checksum results in a most likely checksum that indicates a fewest number of errors of the plurality of candidate checksums.

12. The decoder of claim 11, wherein the set of selectable inverse transformations are such that when a single bit error is present in the first codeword, none of the plurality of candidate checksums indicates that there are no errors in the first codeword.

13. The decoder of claim 11, further comprising:
   a retransmission request circuit to request retransmission of the first codeword responsive to the candidate selector logic determining that two or more inverse transformations when applied to the first status-encoded checksum result in candidate checksums indicating the fewest number of errors.

14. The decoder of claim 10, wherein the error correction decoder comprises at least one of a Hamming decoder, a Chipkill decoder, a BCH decoder, and a Reed-Solomon decoder.

15. The decoder of claim 10, wherein the transformation comprises at least one of: a permutation, a rotation, a bit inversion, and an identity transformation.

16. The decoder of claim 10, wherein the status condition comprises one of an acknowledge condition, a no acknowledge condition, and a null condition.

* * * * *